United States Patent [19]
Bonora et al.

[11] Patent Number: 5,169,272
[45] Date of Patent: Dec. 8, 1992

[54] METHOD AND APPARATUS FOR TRANSFERRING ARTICLES BETWEEN TWO CONTROLLED ENVIRONMENTS

[75] Inventors: Anthony C. Bonora, Menlo Park, Calif.; Gilles Guerre, Les Loges en Josas, France; Mihir Parikh, San Jose, Calif.; Frederick T. Rosenquist, Redwood City, Calif.; Sudhir Jain, Santa Clara, Calif.

[73] Assignee: Asyst Technologies, Inc., Milpitas, Calif.

[21] Appl. No.: 607,898

[22] Filed: Nov. 1, 1990

[51] Int. Cl.⁵ .............................. B65B 1/04
[52] U.S. Cl. ..................... 414/217; 414/422
[58] Field of Search ........... 414/217, 221, 292, 287, 414/411, 422

[56] References Cited

U.S. PATENT DOCUMENTS

| | | | |
|---|---|---|---|
| 4,405,435 | 9/1983 | Tateishi et al. | 414/217 X |
| 4,532,970 | 8/1985 | Tullis et al. | 414/729 X |
| 4,534,389 | 8/1985 | Tullis | 414/729 X |
| 4,619,572 | 10/1986 | Lorenzelli et al. | 414/217 |
| 4,707,334 | 11/1987 | Gerhard | 414/217 X |
| 4,724,874 | 2/1988 | Parikh et al. | 414/217 X |
| 4,781,511 | 11/1988 | Harada et al. | 414/217 |
| 4,797,054 | 1/1989 | Arii | 414/217 |
| 4,815,912 | 3/1989 | Maney et al. | 414/217 |
| 4,995,430 | 2/1991 | Bonora et al. | 414/217 X |

Primary Examiner—David A. Bucci
Assistant Examiner—James Keenan
Attorney, Agent, or Firm—Fliesler, Dubb, Meyer & Lovejoy

[57] ABSTRACT

A method and apparatus for transferring articles from a transportable container, for example, a SMIF pod, to a second container, for example, a processing station having a port which provides access to the interior region of the processing station. A non-contact seal or an isolation cover or skirt seals the port so that the interior region of the container can be purged of contaminants prior to exposing the interior environment of the processing station to the environment within the container. The purging of the container may be a multi-step process in which the container door is moved between several intermediate positions so that the container door iself is purged prior to the purging of the environment within the container.

11 Claims, 8 Drawing Sheets

METHOD AND APPARATUS FOR TRANSFERRING ARTICLES BETWEEN TWO CONTROLLED ENVIRONMENTS

CROSS-REFERENCE TO RELATED APPLICATIONS AND PATENTS

This Application is related to the following Applications/Patents, all assigned to the assignee of the subject Application:

SEALED STANDARD INTERFACE APPARATUS, Inventors: George Allen Maney, Andrew William O'Sullivan, W. George Faraco, Ser. No. 635,384, Filed: July 30, 1984, U.S. Pat. No. 4,674,939;

INTELLIGENT WAFER CARRIER, Inventors: George Allen Maney, Anthony Charles Bonora, Mihir Parikh, Ser. No. 054,212, Filed: May 18, 1987 U.S. Pat. No. 5,097,421, which is a continuation-in-part of Ser. No. 686,444, Filed: Dec. 24, 1984, now abandoned.

BOX DOOR RETAINER, Inventors: George Allen Maney, W. George Faraco, Mihir Parikh, Ser. No. 686,443, Filed: Dec. 24, 1984, U.S. Pat. No. 4,815,912;

LONG ARM MANIPULATOR FOR STANDARD MECHANICAL INTERFACE APPARATUS, Inventors: Anthony Charles Bonora, Andrew William O'Sullivan, Ser. No. 769,709, Filed: Aug. 26, 1985, U.S. Pat. No. 4,676,709;

SHORT ARM MANIPULATOR FOR STANDARD MECHANICAL INTERFACE APPARATUS, Inventors: Anthony Charles Bonora, Ser. No. 769,850, Filed: Aug. 6, 1985, U.S. Pat. No. 4,674,936;

CONTAINER HAVING DISPOSABLE LINERS, Inventors: Mihir Parikh, Anthony Charles Bonora, W. George Faraoo, Barney H. Huang, Ser. No. 829,447, Filed: Feb. 13, 1986, U.S. Pat. No. 4,739,882;

SEALABLE TRANSPORTABLE CONTAINER HAVING A PARTICLE FILTERING SYSTEM, Inventors: Mihir Parikh, Anthony C. Bonora, Ser. No. 840,380, Filed: May 1, 1986, U.S. Pat. No. 4,724,874; and SEALABLE TRANSPORTABLE CONTAINER HAVING IMPROVED LATCH MECHANISM, Inventors: Anthony Charles Bonora, Frederick Theodore Rosenquist, Ser. No. 354,027, Filed: May 19, 1989, U.S. Pat. No. 4,995,430.

Each of these related Applications/Patents is incorporated herein by reference.

BACKGROUND OF THE INVENTION

1. Field of the Invention

The present invention relates to standardized mechanical interface (SMIF) systems for reducing particle contamination, and more particularly to systems for transferring articles from a transportable container (e.g. a SMIF pod), which is sealable to prevent influence of external factors on the contents of the container, to a processing station, and returning articles from the processing station to the transportable container.

2. Description of the Related Art

A standardized mechanical interface (SMIF) system has been proposed by the Hewlett-Packard Company as disclosed in U.S. Pat. Nos. 4,532,970 and 4,534,389. The purpose of the SMIF system is to reduce particle fluxes onto articles, for example, semiconductor wafers. This end is accomplished, in part, by mechanically ensuring that during transportation and storage the gaseous media (such as air or nitrogen) surrounding the wafers is essentially stationary relative to the wafers and by ensuring that particles from the ambient environment do not enter the immediate wafer environment.

The SMIF concept is based on the realization that a small volume of controlled (with respect to motion, air flow direction and external contaminants), particlefree air provides a clean environment for wafers. Further details of one proposed system are described in the article entitled "SMIF A TECHNOLOGY FOR WAFER" CASSETTE TRANSFER IN VLSI MANUFACTURING, " by Mihir Parikh and Ulrich Kaempf, *Solid State Technology.* July 1984, pp. 111-115. SMIF systems are concerned with particle sizes which range from below 0.1 micrometers (microns) to above 200 microns. Particles with these sizes can be very damaging in semiconductor processing because of the small geometries employed in fabricating semiconductor devices. Typical advanced semiconductor processes today employ geometries which are 1 micron and under. Unwanted contamination particles which have geometries measuring greater than 0.05 microns substantially interfere with 1 micron geometry semiconductor devices. The trend, of course, is to have smaller and smaller semiconductor processing geometries which today in research and development labs approach 0.5 microns and below. In the future, geometries will become smaller and smaller and hence smaller and smaller contamination particles become of interest.

A SMIF system has three main components: (1) minimum volume, sealed pods used for storing and transporting wafer cassettes; (2) canopies placed over cassette ports and wafer processing areas of processing equipment so that the environments inside the pods and canopies (after having clean air sources) become miniature olean spaces; and (3) a transfer mechanism to load/unload wafer cassettes from a sealed pod without contamination of the wafers in the wafer cassette from external environments.

Wafers are stored and transported in pods, and are transferred from a pod to a piece of processing equipment in the following manner. First, a pod is placed at the interface port on top of the canopy. Each pod includes a box and a box door designed to mate with doors on the interface ports of the processing equipment canopies. Then, latches release the box door and the canopy port door simultaneously; the box door and the interface port door are opened simultaneously so that particles which may have been on the external door surfaces are trapped ("sandwiched") between the box and interface port doors. A mechanical elevator lowers the two doors, with the cassette riding on top, into the canopy covered space. A manipulator picks up the cassette and places it onto the cassette port/elevator of the equipment. After processing, the reverse operation takes place.

In U.S. Pat. No. 4,724,874 a SMIF pod is disclosed in which a fitting is provided in the SMIF pod to allow fluids to be removed from or introduced to the interior region on the SMIF pod. The fitting provides communication between the interior region of the SMIF pod and the region outside the SMIF pod, and may be used, for example, to create a vacuum in the interior of the SMIF pod, to create an over-pressure in the interior region of the SMIF pod, and/or to introduce fluids (gases), such as helium, nitrogen, or other selected gases, into the interior region of the SMIF pod.

Processing stations, which receive materials to be processed from SMIF pods, may include an interior region having an atmosphere which is maintained as controlled humidity (e.g., dehumidified) air, nitrogen, argon, or another appropriate gas. In situations where the processing equipment has a controlled atmosphere, it is desirable to prevent contamination of the controlled atmosphere in the processing equipment when loading articles from a SMIF pod to the processing equipment. One mechanism for preventing such contamination is to use the SMIF pod disclosed in U.S. Pat. No. 4,724,874, and to control the environment in the interior region of the SMIF pod by the removal or introduction of appropriate gases into the SMIF pod. However, many SMIF pods currently in use do not have a facility for controlling the atmosphere in the interior of the SMIF pod once the SMIF pod is closed.

In addition, the door of a pod, which is lowered into the processing equipment in the process of transferring articles from the SMIF pod to the processing equipment has a certain volume of uncontrolled atmosphere. Accordingly, gases contained within the pod door can contaminate the controlled atmosphere of the processing equipment as the pod door is introduced into the process equipment.

SUMMARY OF THE INVENTION

It is, therefore, an object of the present invention to provide a method and apparatus for transferring articles from a SMIF pod to a processing station without contaminating the environment in the processing station.

A further object of the present invention is to provide for the use of a conventional SMIF pod with processing equipment having a controlled atmosphere.

Another object of the present invention is to provide a method and apparatus for controlling the interaction of a SMIF pod and a processing station.

Another object of the present invention is to provide a processing station and a SMIF pod which operate to form a contact or a non-contact gas seal, thereby permitting the interior region of the SMIF pod to be purged without contaminating the internal environment of the processing equipment.

These and other objects of the present invention are provided by a method of and an apparatus for transferring articles from a SMIF pod to a processing station or transferring articles from a processing station to a SMIF pod in which the environment inside the SMIF pod is purged before this environment is exposed to the atmosphere inside the processing station. One manner of purging the SMIF pod is to create a non-contact gas seal by opening the port door of the processing station by a small amount and to create a differential pressure with respect to the pressure in the SMIF pod. The differential pressure is defined as the relationship of the relative pressures in the SMIF pod, the processing station, a gas inlet to the port assembly of the processing station, and a gas outlet form the port assembly. The differential pressure causes the gas inside the processing equipment to escape through the small aperture between the port door and the processing station, thereby preventing gas from entering the interior region of the processing station through the non-contact gas seal. In conjunction with providing the gas seal, a reduced pressure is created in the port region of the processing equipment in order to remove contaminates and the gas from both the pod door and the interior region of the pod as the pod is opened. The gas seal is maintained until the purging of the interior environment of the SMIF pod is completed. The pod loading or unloading operation includes lowering the pod door to a first position to open the pod and to allow the atmosphere inside the pod door to be purged, lowering the pod door to a second position to allow the interior region of the pod to be purged, and lowering the pod door to a third position in which materials may be transferred to or from the pod.

An additional feature of the invention is the provision of a port door cover or a skirt which creates an isolation region within the processing station. A port door cover isolation region which contains the port door and the isolation region is maintained throughout the purging process. A port door skirt is used in conjunction with a gas seal; in a first phase of two purging processes a gas seal is used and in a second phase an isolation region is established by a contact seal. The port door cover or skirt may be biased to a sealing position by springs connected between the port door cover and the port door.

An apparatus, in accordance with the present invention, for transferring articles between two controlled environments, comprises:

a first container having a first interior region, said first container including first means for providing access to said first interior region and for establishing a controlled environment isolated from ambient atmospheric conditions in said first interior region;

a second container having a second interior region, said second container including second means for providing access to said second interior region, receiving said first container, and making a seal with said first container;

third means for creating a differential pressure in said first and second interior regions; and fourth means for opening said first means and said second means so that said differential pressure in said first and second interior regions purges gas from said first interior region and so that said gas purged from said first interior region is prevented from entering said second interior region.

An apparatus, in accordance with the present invention, for removing articles from a sealable container, comprises a container having an interior region and a door which makes a seal with the container to establish a controlled environment isolated from ambient atmospheric conditions in said interior region, a processing station having an interior region, a port, provided on said processing station, which provides access to said interior region of said processing station, receives said container, and makes a seal with said container, said port having a gas outlet, means for creating a vacuum in said gas outlet, means for opening said door of said container and said port so that said vacuum in said gas outlet removes gas from said interior region of said container and so that the relative pressures of said interior region of said container and said interior region of said processing station prevent gas from entering said interior region of said processing station through said port.

These and other objects and advantages of the invention will appear more clearly from the following description in which the preferred embodiments of the invention have been set forth in detail in conjunction with the drawings.

DESCRIPTION OF THE PREFERRED EMBODIMENTS

The present invention will be described in the context of a SMIF system for storing and transporting wafers and/or articles. However, it is to be understood that a sealable, transportable container in accordance with the present invention may be used to store and transport many other inanimate objects (or materials) as well as living objects such as laboratory animals.

The general structure of a SMIF pod and the mating of a SMIF pod with processing equipment are described in U.S. Pat. No. 4,724,874. For completeness, a brief description of the disclosure is provided herein.

Figure 1A:
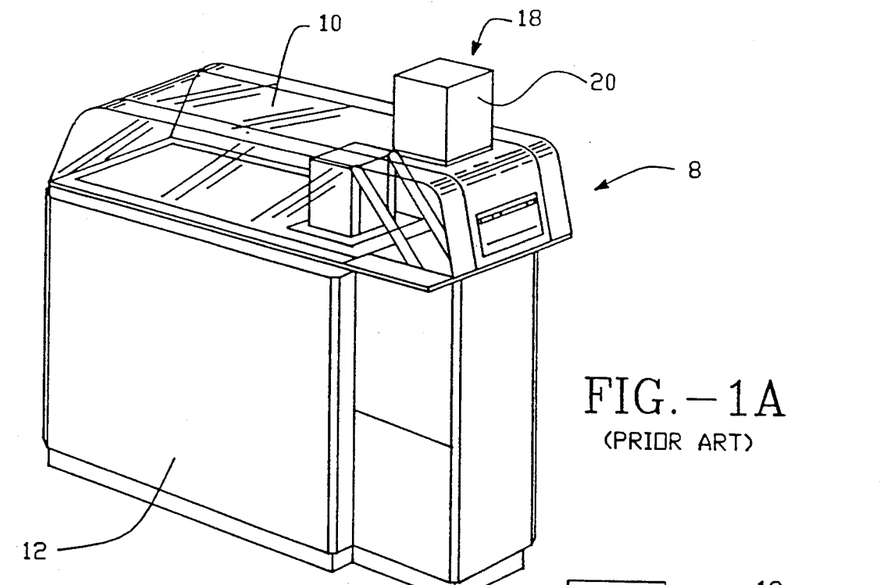
FIG. 1A is an isometric view of a processing station having a canopy for receiving a SMIF pod.
Figure 1B:
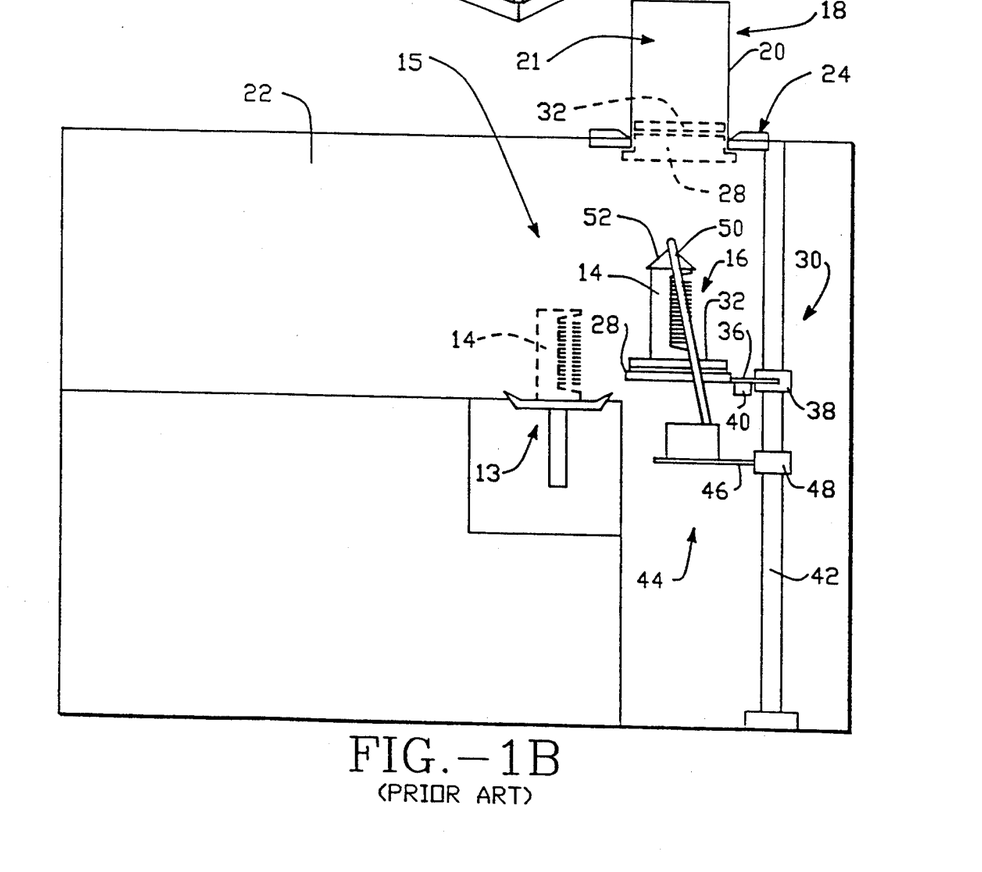
FIG. 1B is a cutaway side view of the processing station of FIG. 1.
Figure 2:
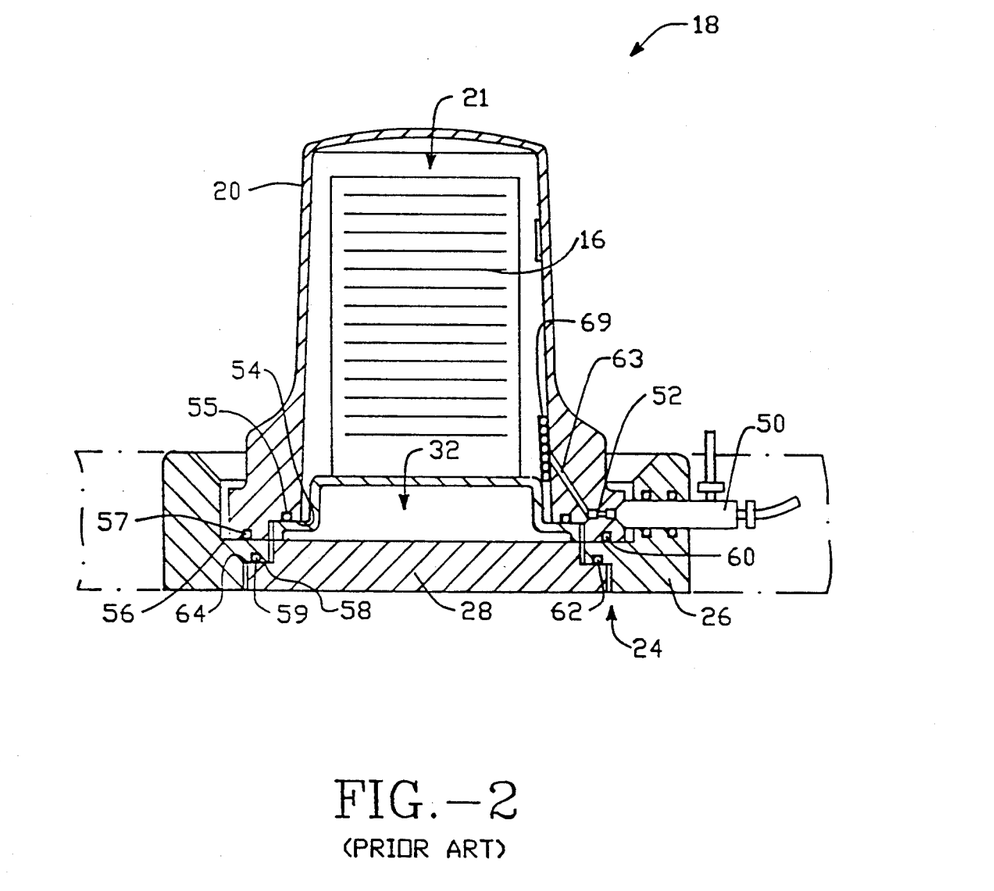
FIG. 2 is a sectional view of a SMIF pod and portions of a port assembly for receiving the SMIF pod.

FIGS. 1 and 2 illustrate a processing station 8 having a canopy 10 which is an easily removable shield that covers the wafer handing mechanism of processing equipment 12. Equipment 12 may be, for example, a photo resist applicator, mask aligner, inspection station or any similar processing equipment. The canopy 10, which is constructed of transparent plastic such as acrylic or Lexan to facilitate visual inspection and/or maintenance within the canopy 10, encloses the handling mechanisms of the processing equipment 12 and a holder 14, such as a wafer cassette holding wafers 16. The environment within the processing equipment 15 is separately maintained and separately cleaned and therefore the equipment 12 need not be installed in a clean room.

A sealable, transportable container (or pod) 18 having a box (or box top) 20 having an interior region 21 and a box door 32 is mounted on the horizontal surface 22 of canopy 10 by a port assembly 24. The port assembly 24 includes a port plate 26, port door 28, and an elevator mechanism 30. Elevator mechanism 30 transports a cassette holder 14, containing the integrated circuit wafers 16 from the interior region 21 of box 20 into the region beneath the canopy 10. In FIG. 1B, port door 28 and box door 32 are shown in the closed position by the dotted lines. A manipulator assembly 44 includes a platform 36, a shaft engagement device 38 and a drive motor 40. The platform 36, extending from the elevator assembly 30, carries the port door 28, the box door 32 and the holder 14 in a vertical direction. The platform 36 is attached by engagement device 38 to a vertical guide 42 of elevator assembly 30.

Typically, guide 42 includes a lead screw (not shown) and the drive motor 40 drives a gear (not shown) which engages the lead screw for driving the platform 36 up or down. When the platform 36 is driven to the closed position, the port door 28 closes the port opening in the canopy 10.

In a similar manner, a manipulator assembly shown generally by the numeral 44 is fastened to a platform 46 which has an engagement means 48 for engaging the vertical guide 42. Manipulator assembly 44 includes a manipulator arm 50 and an engagement head 52 adapted to engage holder 14. By vertical operation of the platforms 36 and 46 and by operation of the manipulator assembly 44, the holder 14 is moved from its position on the box door 32 to a position on the equipment station 13 (as shown by the broken lines).

FIG. 2 shows container 18 mated to port assembly 24 of processing equipment 12. Container 18 is designed for sealably mating with the port assembly 24, and thus box 20 has first and second box top sealing surfaces 54, 56, respectively. Box door 32 has a first box door sealing surface 58 for sealably mating with the first box top sealing surface 54, and gasket 55 between surfaces 54 and 58 provides a seal. Port plate 26 has first and second port plate sealing surfaces 60, 62, respectively. The first port plate sealing surface 60 sealably mates with the second box top sealing surface 56, making a second seal as gasket 57 is compressed.

Port door 28 has a first port door sealing surface 64 which sealably mates with the second port plate sealing surface 62; a third seal is provided by gasket 59. The box top 20 may include a conduit 63 defining a channel between valve 52 and the interior space 21 of box 20. At one end of channel 63 is a filter 69 for filtering fluids (e.g., gasses) passing therethrough.

When the first, second and third seals are made, the interior space 21 of box 20 may be cleaned by alternately evacuating/pressurizing the interior space 21. In order to evacuate interior space 21, injection/extractor 50 is activated to withdraw fluid from interior space 21. As the fluids are withdrawn, they pass through filter 69, through channel 63 and through a coaxial valve (not shown) of injection/extractor 50.

The port door 28 includes a latch actuating mechanism (not shown) for releasing box door 32 from box 20. Wafers 16 can be moved by elevator mechanism 30 and manipulator assembly 44 into the proper position in the processing equipment 12 for processing without human intervention.

A method and apparatus for controlling the environments in a SMIF pod and a processing station during the loading and/or unloading of a SMIF pod, in accordance with the present invention, will be described with reference to FIGS. 3–6.

The interior region 15 of processing equipment 12 defines an environment having a pressure $P_2$, and the interior region 21 of container 18 defines an environment having a pressure $P_1$. The seal provided between port plate 26 and port door 28 at location 59 (e.g., a gasket or a metal-to-metal seal) isolates region 15 from ambient atmospheric conditions. Likewise, the seal between box 20 and box door 32, provided by gasket 55, isolates region 21 from ambient atmospheric conditions.

Figure 3:
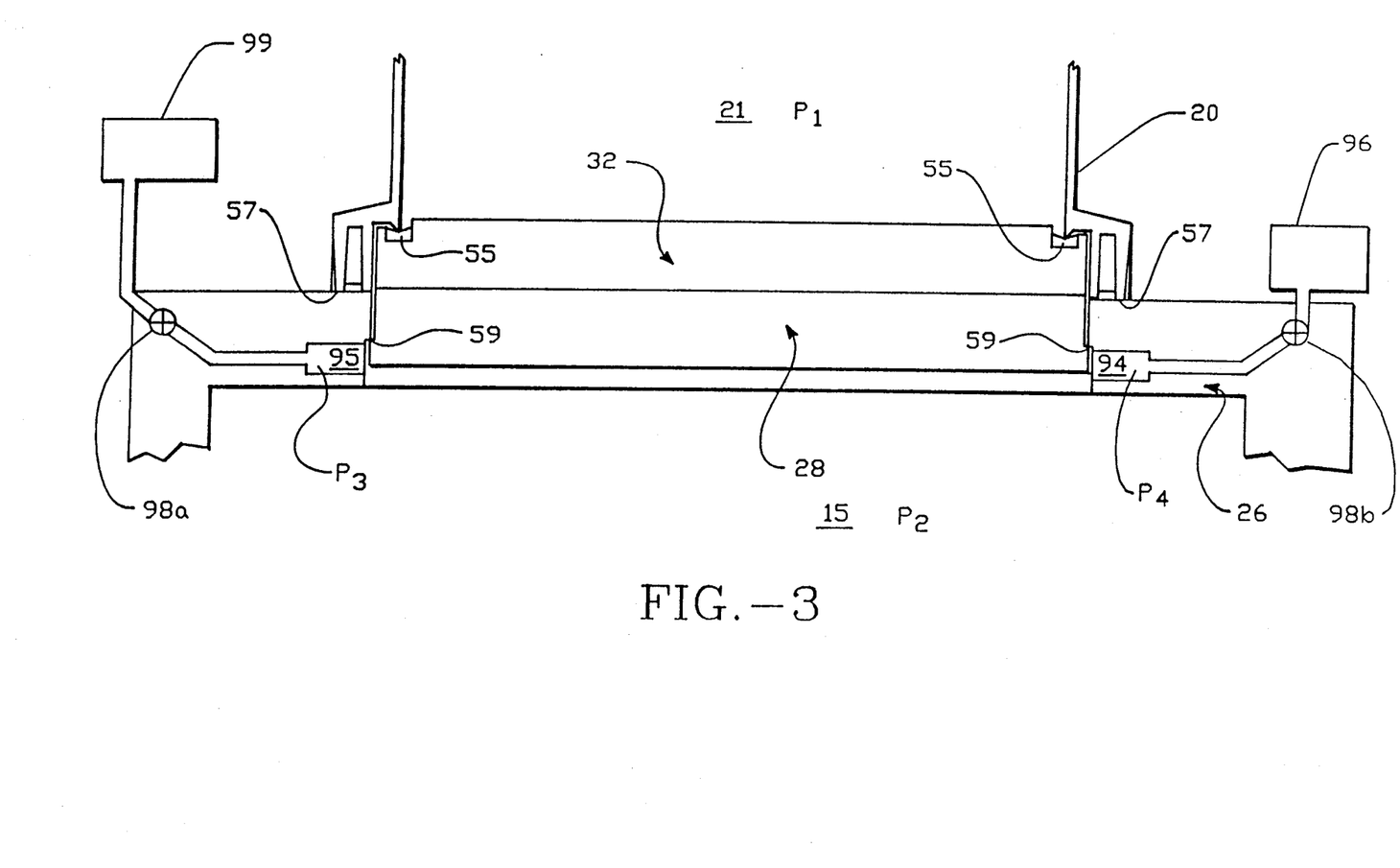
FIG. 3–5 are partial sectional views of a SMIF pod and the port of a processing station with the port door in closed, intermediate, and second intermediate position, respectively.

FIG. 3 shows a box 20 mated with port plate 26, with both port door 28 and box door 32 in the closed position so that regions 15 and 21 are sealed. Box 20 may be mechanically latched to port plate 26. Box door 32 may include a safety mechanism (interlock) which prevents box door 32 from being opened unless box 20 is latched to port plate 26. Alternatively, the interlock may be provided through software control of manipulator 44. In addition, box door 32 may be latched to port door 28 by mechanical means; alternatively, box door 32 may be allowed to rest freely on port door 28, held in place by gravity.

Prior to breaking the seals provided by gaskets 55 and 59, so that articles may be transferred from region 21 to region 15, region 15 is maintained in a particle free condition. The particle free condition of region 15 may be provided by, for example, using vacuum pumps to evaluate region 15 and then backfilling region 15 with pure gases obtained from bottles. The gas introduced in environment 15 may be nitrogen ($N_2$) maintained at a pressure slightly higher than or equal to atmospheric pressure.

An outlet port 94 and an inlet port 95 are provided in port plate 26. An exhausting sink 96, e.g., vacuum pump, may be attached to outlet port 94 to create a reduced pressure in outlet port 94. A source of pure gas 99, for example, bottled nitrogen ($N_2$) having a purity on the order of 99.999%, is provided at inlet port 95. Inlet and outlet ports 94, 95 may be selectively sealed through the use of one or more valves 98a, 98b. Further, an exhausting sink and a source of gas may be connected to one inlet/outlet port under the control of multiple valves.

Figure 4:
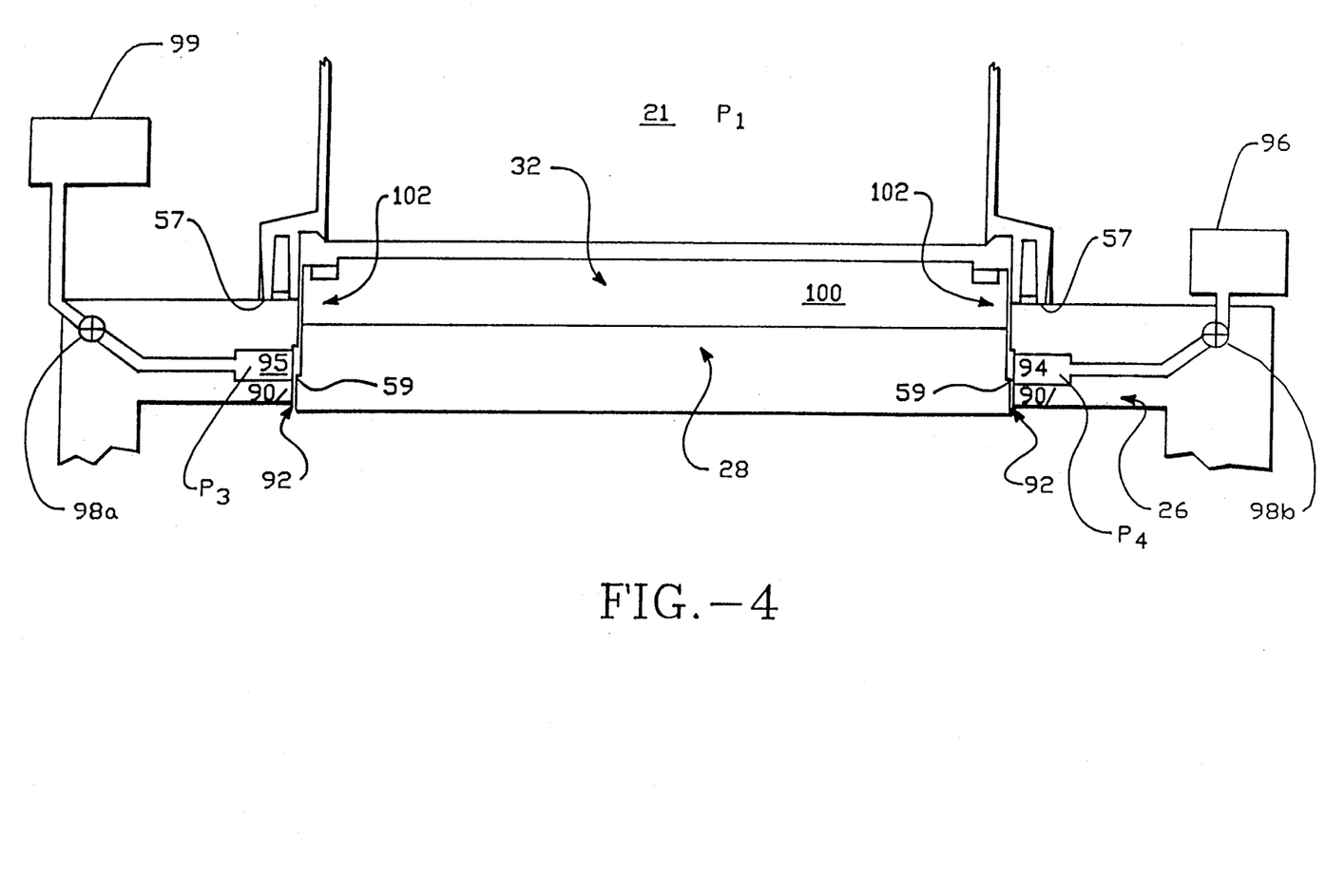

The first step in the transfer process, as shown in FIG. 4, is to open port door 28 and box door 32 through downward motion of port door 28. The port door 26 and box door 32 are opened by a small amount in this first step, placing the port door 28 in a first open position. Port plate 26 is designed so that a mating region 90 of port plate 26 forms a non-contact, gas seal 92 with respect to port door 28 when the port door 28 is in the first open position. The non-contact gas seal 92 is essentially a small gap on the order of 1–100 mils, 15–30 mils in the preferred embodiment. The size of non-contact gas seal 92 is application dependent, varying with factors such as the type of gas (or gases) utilized and the purity desired. A higher purity requires a smaller gap, whereas a lower purity allows the use of a larger gap. A non-contact seal is desirable because a contact seal would require either scraping of the elements forming the seal or mechanical motion of a sealing element, both of which would tend to generate contaminant particles.

Non-contact gas seal 92 functions in conjunction with a differential pressure. A differential pressure is defined by the pressures $P_1$ and $P_2$, and by pressures $P_3$ in inlet port 95 and $P_4$ in outlet port 94. Table 1 specifies the relationships of these pressures for various types of seals and various operations.

In operation, an over-pressure in region 15 causes a flow of gas from region 15 through the non-contact seal 92 and into outlet port 94. From outlet port 94, the gas escaping from environment 15 is vented to an environment external to the SMIF system. The flow of gas out of region 15 through non-contact seal 92 prevents contaminants from entering region 15 through non-contact seal 92. A vacuum in outlet port 94 serves to enhance the flow through non-contact seal 92 and aids in removing the gas escaping from region 15. However, an over-pressure in region 15 is sufficient to exhaust the gasses expelled through non-contact seal 92, and thus an exhausting sink 96 may not be required.

The reduced pressure provided by exhausting sink 96 is also used to evacuate region 21, and a third region 100 within box door 32, thereby removing contaminate particles and gases from these regions. When port door 28 and box door 32 are in the position shown in FIG. 4, a reduced pressure created in outlet port 94 will serve to evacuate region 100. Region 100 houses a latch mechanism (not shown) which protrudes through openings 102 in box door 32 to engage box 20.

Figure 5:
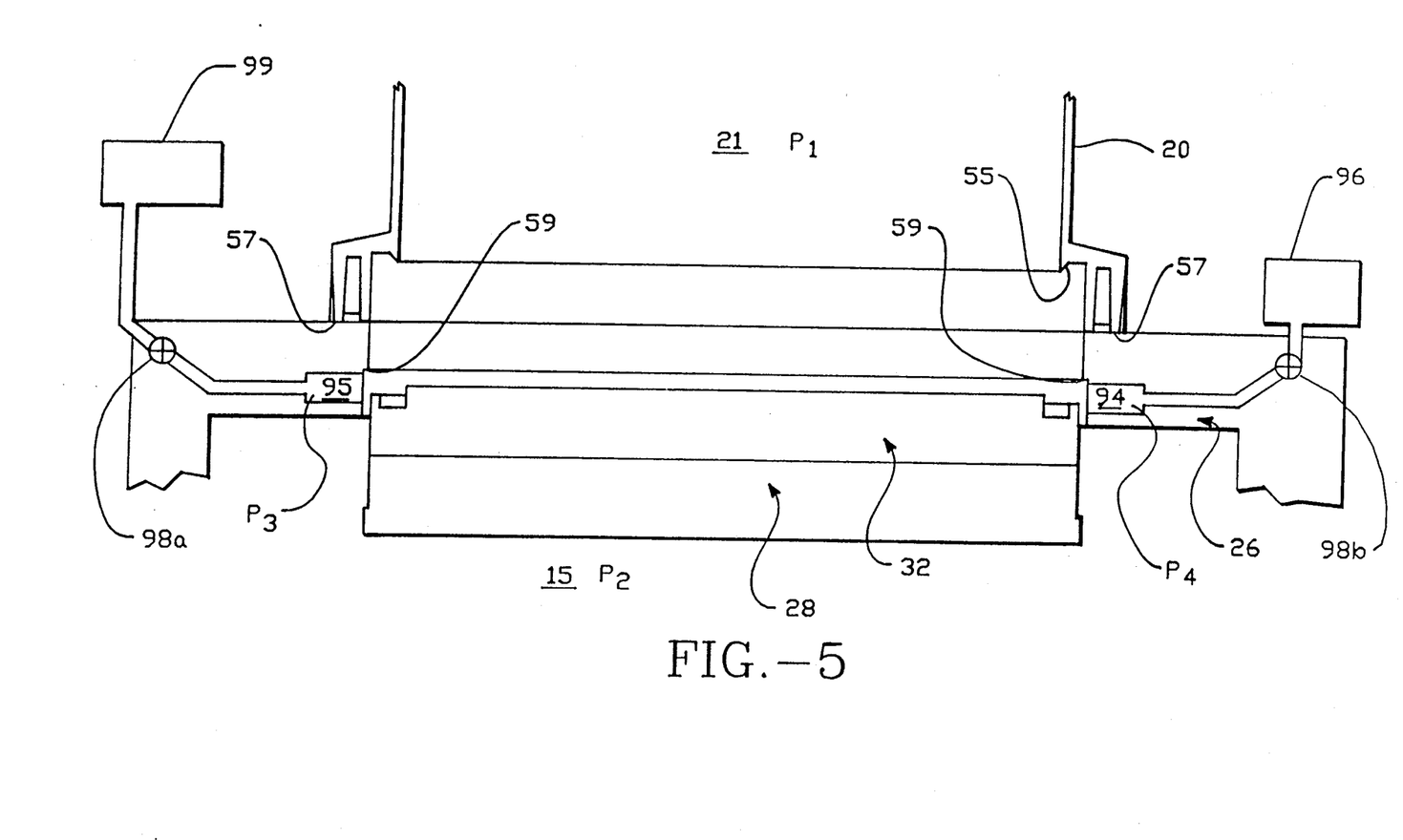

In order to evacuate or purge region 21, port door 28 and box door 32 are lowered to the position shown in FIG. 5, so that region 21 is in communication with outlet port 94. Applying a vacuum to region 21 for several minutes is usually sufficient to purge any contaminate from region 21 and the articles contained therein. In order to remove articles from region 21, port door 28 and box door 32 are lowered further, as shown in FIG. 1B.

Figure 6A:
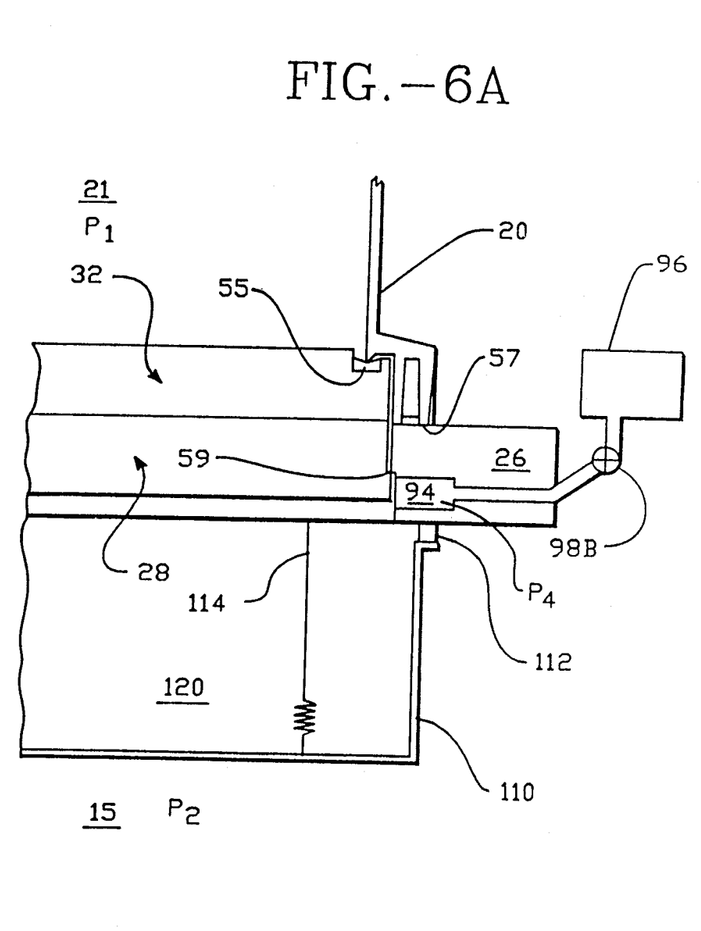
FIGS. 6A, 7A and 8A are partial sectional views of a SMIF pod and the port of a processing station having a port door cover with the port door in first, second, and third positions, respectively.
Figure 6B:
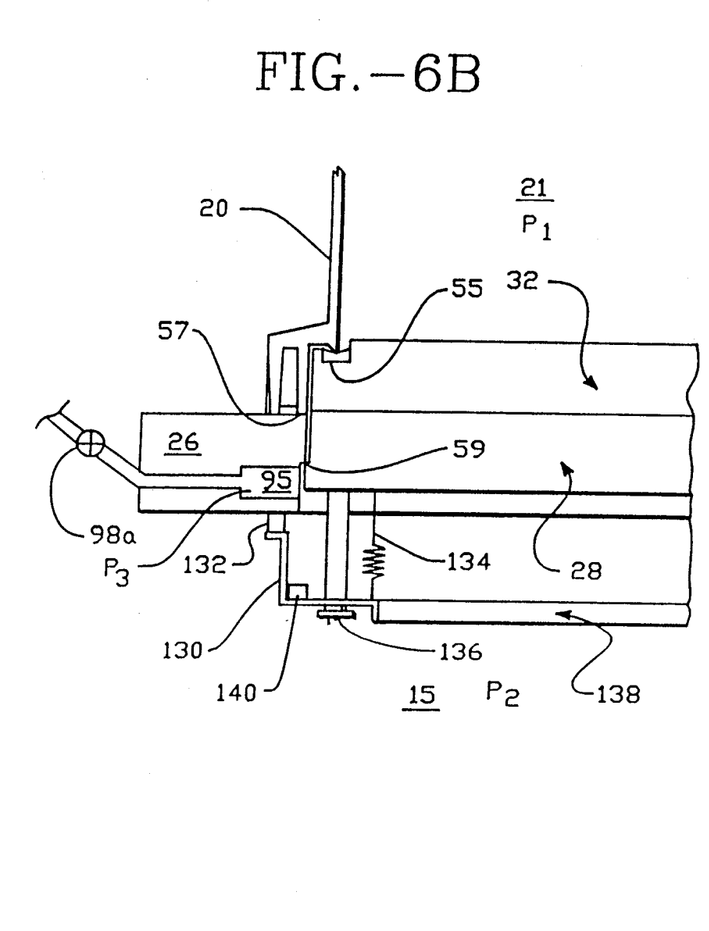
FIGS. 6B, 7B and 8B are partial sectional views of a SMIF pod and the port of a processing station having a port door skirt, with the port door in first, second, and third positions, respectively.
Figure 7A:
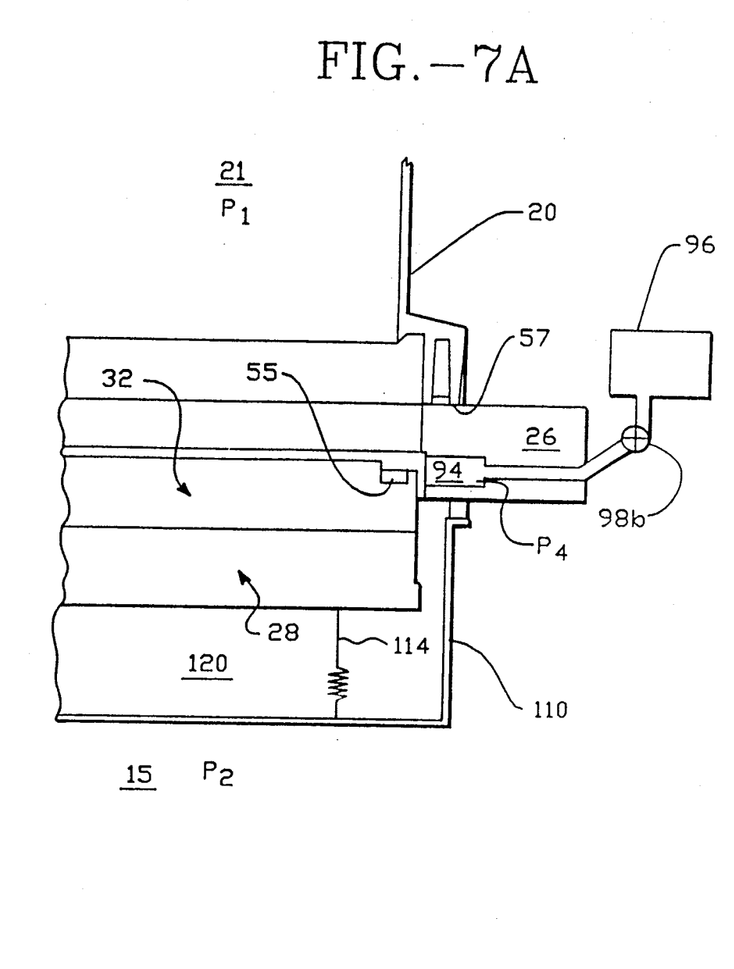
Figure 7B:
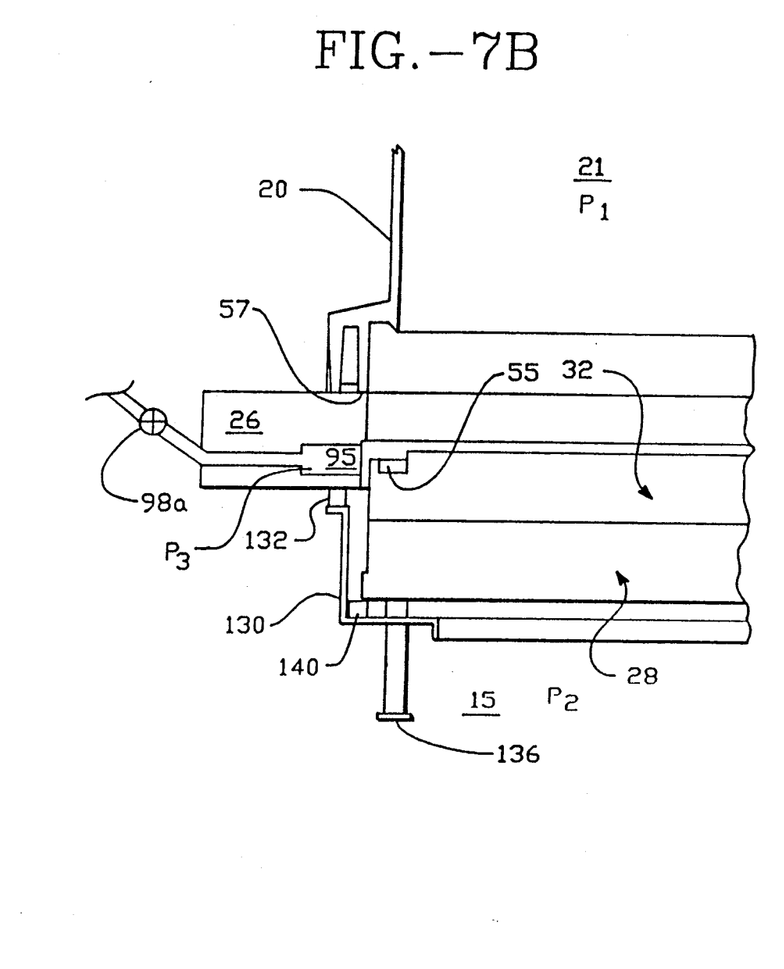
Figure 8A:
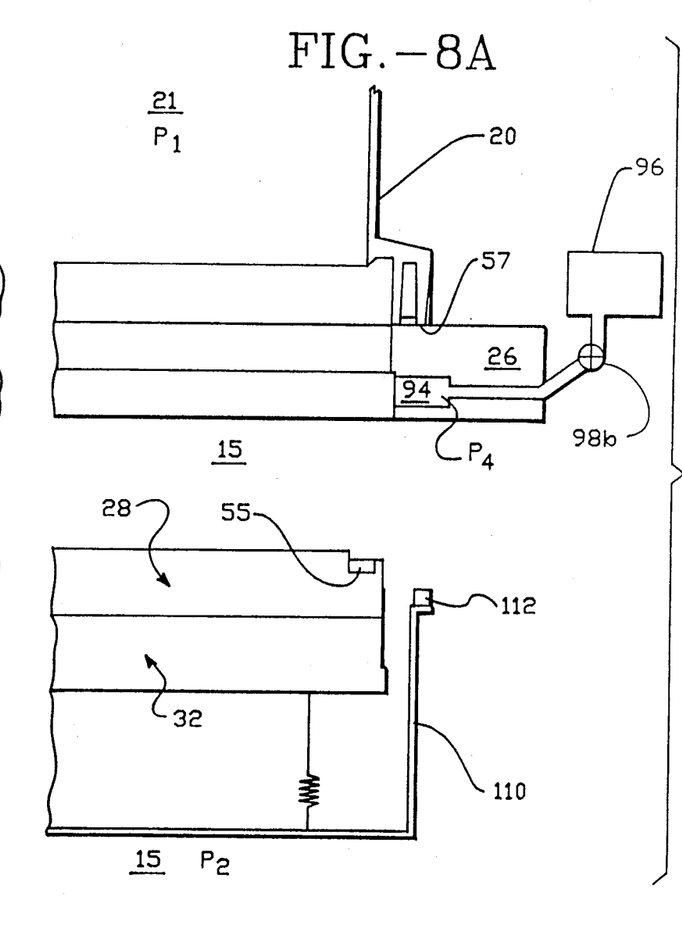
Figure 8B:
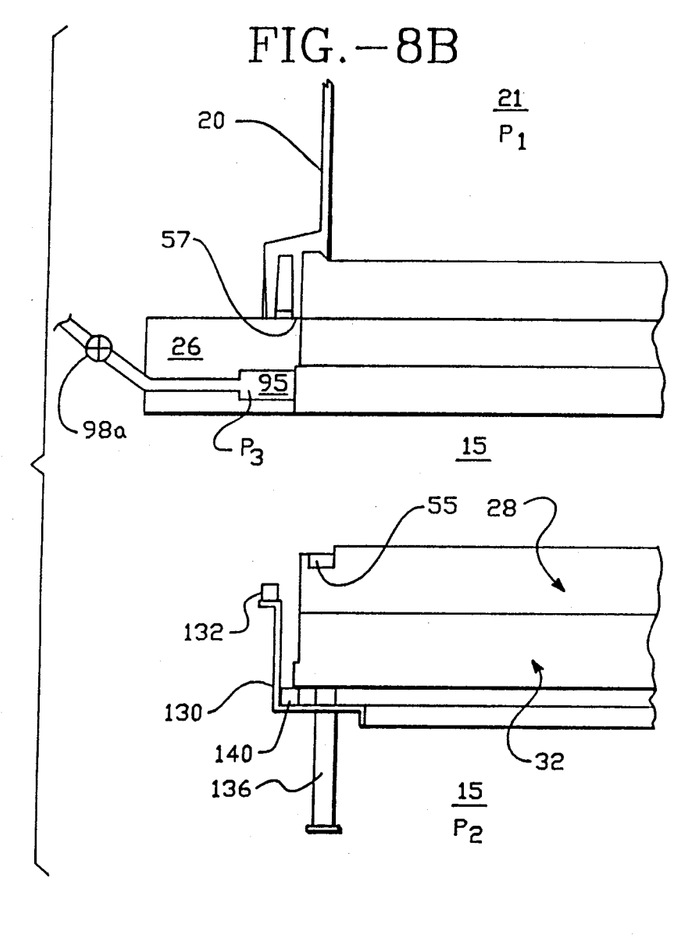

FIGS. 6–8 illustrate the addition of a port door cover 110 or a port door skirt 130 to the system. Port door cover is shown in FIGS. 6A, 7A, and 8A and port door skirt 130 is shown in FIGS. 6B, 7B, and 8B.

Port door cover 110 forms a seal with port plate 26 through gasket 112. A sealing force is provided by spring 114 which attaches port door cover to port door 28. For simplicity, only one spring is shown. However, it is contemplated that either a single spring attached to a pulley mechanism or multiple springs attached directly between port door cover 110 and port door 28 may be utilized. The sealing force biases port door cover 110 toward port door 28, thereby compressing gasket 112.

TABLE 1

| | Operation | | | |
|---|---|---|---|---|
| Sealing Method | Loading Processing Station - $P_2$ protected | Unloading Processing Station - $P_2$ protected | Unloading Processing Station - $P_2$ unprotected | SMIF Pod Storage or Transport - $P_2$ unprotected |
| Non-contact Gas Seal | $P_3 > P_1$<br>$P_2 > P_1$<br>$P_4 < P_1$ | $P_3 > P_1$<br>$P_2 > P_1$<br>$P_4 < P_1$ | $P_3 > P_1$<br>$P_2 < P_1$<br>$P_4 < P_1$ | $P_3 > P_1$<br>$P_2 < P_1$<br>$P_4 < P_1$ |
| Port Door Cover | $P_2$ Independent<br>$P_3 > P_1$<br>$P_4 < P_1$ | $P_2$ Independent<br>$P_3 > P_1$<br>$P_4 < P_1$ | N/A | $P_2$ Independent<br>$P_3 > P_1$<br>$P_4 < P_1$ |
| Combination: Non-contact Gas Seal and Port Door Skirt | Stage 1 (Gas Seal)<br>$P_2 > P_1$<br>$P_3 \geqq P_1$<br>$P_4 \leqq P_1$<br>Stage 2 (Contact Seal)<br>$P_2$ Independent<br>$P_3 > P_1$<br>$P_4 < P_1$ | Stage 1 (Gas Seal)<br>$P_2 > P_1$<br>$P_3 \geqq P_1$<br>$P_4 \leqq P_1$<br>Stage 2 (Contact Seal)<br>$P_2$ Independent<br>$P_3 > P_1$<br>$P_4 < P_1$ | Stage 1 (Gas Seal)<br>$P_2 < P_1$<br>$P_3 \geqq P_1$<br>$P_4 \leqq P_1$<br>Stage 2 (Contact Seal)<br>$P_2$ Independent<br>$P_3 \geqq P_1$<br>$P_4 \leqq P_1$ | Stage 1 (Gas Seal)<br>$P_2 < P_1$<br>$P_3 \geqq P_1$<br>$P_4 < P_1$<br>Stage 2 (Contact Seal)<br>$P_2$ Independent<br>$P_3 > P_1$<br>$P_4 < P_1$ |

Port door cover 110 creates a fourth region 120, which isolates region 15. Port door cover 110 may be used in place of or in addition to the non-contact seal 92. A differential pressure is used to evacuate region 120. For example, a reduced pressure applied to outlet port 94 may be used to evacuate and purge contaminants from region 120; alternatively, a differential pressure may be created by introducing a purge gas at an overpressure in inlet port 95. Region 120 may be evacuated before or after port door 28 is opened. When port door 28 is in the closed position, as shown in FIG. 6A, spring 114 creates a relatively large biasing force to maintain the seal between port door cover 110 and port plate 26.

Manipulator 44 protrudes through cover 110 to connect to port door 28. Several alternative sealing arrangements may be used in connection with manipulator 44; for example, a non-contact gas seal may be established between manipulator 44 and cover 110, or a bellows or diaphragm (not shown) may be provided.

As port door 28 is lowered to a first intermediate position, as shown in FIG. 7A, box door 32 is adjacent to outlet port 94, and the reduced pressure applied to outlet port 94 will purge the contaminants from the region 100. As purging continues gases and contaminants in region 21 are removed through outlet port 94. Alternatively, as shown in FIGS. 1-3, port door 28 may be lowered to a second intermediate position so that region 21 is in direct communication with outlet port 94. Thereafter, as shown in FIG. 8A, port door 28 is lowered further, breaking the seal between port door cover 110 and port plate 26 to allow articles to be transferred from region 21 to region 15 inside processing station 12.

Port door skirt 130 forms a seal with port plate 26 through gasket 132. A sealing force is provided by spring 134 which attaches port door cover to port door 28. For simplicity, only one spring is shown. However, as discussed with respect to the port door cover 110, it is contemplated that either a single spring attached to a pulley mechanism or multiple springs may be utilized. The sealing force biases port door skirt 130 toward port door 28, thereby compressing gasket 132. Guides 136 are attached to port door 28 to control the movement of skirt 130. Because skirt 130 has an opening 138, it is not necessary to provide a seal around manipulator 44.

In operation, the embodiment shown in FIGS. 6B, 7B, and 8B uses a differential pressure and combination of a non-contact gas seal and a contact seal to protect region 15 during purging of region 21. FIG. 6B shows port door 28 and box door 32 in the sealed positions. During the purging operation, port door 28 is opened and a non-contact gas seal, as shown in FIG. 4 protects region 15. A differential pressure, as specified in Table 1, maintains the non-contact gas seal, while port door 28 is lowered to the position shown in FIG. 7B to contact gasket 140, thereby forming a seal between port door 28 and skirt 130. The seal between port door 28 and skirt 130 isolates region 15, allowing the purging operation to continue without a continued flow of gas out of region 15. FIG. 8B shows port door 28 in the fully lowered position to allow articles to be transferred from region 21 to region 15.

In general, container 18 remains attached to processing equipment 12 during the period that the articles transferred from container 18 (region 21) to processing station 12 (region 115) are processed. In this situation, the articles may be returned directly to container 18. However, this is not always the situation. For example, selected articles from several containers may be processed simultaneously, requiring several repetitions of the unloading process in order to collect the selected articles to be processed.

Reloading articles into a container 18 involves the same process as unloading the container 18. In particular, the process of purging regions 21, 100 and 120 while region 15 is sealed either by non-contact seal, a port door cover 110, or a port door skirt 130 is performed prior to transferring articles from processing station 12 (region 15) to container 18 (region 21).

The many features and advantages of the present invention will be apparent to those skilled in the art from the Description of the Preferred Embodiments and the Drawings. Accordingly, the following claims are intended to cover all modifications and equivalents falling within the scope of the invention.

We claim:

1. An apparatus for interconnecting two controlled environments, comprising:
   a first container having a cover, a bottom, and first means for releasably sealing said cover and said bottom to establish a first interior region having a pressure $P_1$;
   a second container including a second interior region having a pressure $P_2$, said second container including second means for providing access to said second interior region, receiving said first container, and making a seal with said first container;
   third means, comprising a third region having a pressure $P_3$ and a fourth region having a pressure $P_1$, said third region being in communication with said second means and said fourth region being in communication with said second means, for creating a differential pressure in said first and second interior regions and for maintaining the relationships $P_3 > P_1$ and $P_4 < P_1$;
   fourth means for opening said first means and said second means so that gas is poured from said first interior region and so that the differential pressure in said first and second interior regions prevents said gas purged from said first interior region from entering said second interior region; and
   fifth means for isolating said second means from said second interior region when gas is being purged from said first interior region, so that the pressure $P_2$ of said second region remains substantially constant.

2. An apparatus for interconnecting two controlled environments, comprising:
   a container having a first interior region, said container including a container door which makes a seal with the container to establish a controlled environment isolated from ambient atmosphere conditions in said first interior region;
   a processing station having a second interior region, said processing station including a port assembly, including a port door, an inlet, and an outlet, for providing access to said second interior region, receiving said container, and making a seal with said container;
   first means for creating a reduced pressure in said outlet;
   second means for sequentially opening said container door and said port door to a first position in which said port door and said port assembly form a non-contact gas seal so that said reduced pressure in said outlet and a pressure difference between said first interior region and said second interior region removes gas from said first interior region and prevents gas from entering said second interior region through said port door, and then to a second position in which articles may be transferred from said container to said processing station.

3. An apparatus according to claim 2, wherein:

said port door has a top surface, said container door has top and bottom surfaces, and said top surface of said port door interfaces said bottom surface of said container door when said port assembly receives said container; and said second means performs the function of sequentially opening said container door and said port door to a first position in which said interface of said port door and said container door is adjacent to said outlet and said port door and said port assembly from a non-contact gas seal, a second position in which said top of said container door is adjacent to said outlet and said port door and said port assembly form a non-contact gas seal, and a third position in which articles may be transferred from said container to said processing station.

4. An apparatus for removing articles from a sealable, transportable, container, comprising:

a container having an interior region and a door which makes a seal with the container to establish a controlled environment isolated from ambient atmospheric conditions in said interior region, said seal maintaining said interior region at a first pressure;

a processing station having an interior region maintained at a second pressure which is greater than said first pressure;

a port assembly, provided on said processing station, which provides access to said interior region of said processing station, receives said container, and makes a seal with said container, said port assembly having a port door and gas outlet;

means for creating a reduced pressure in said gas outlet;

means for opening said door of said container and said port door so that said reduced pressure in said gas outlet removes gas from said interior region of said container and so that a difference in the pressures of said interior region of said container and said interior region of said processing station prevents a gas from entering said interior region of said processing station through said port door; and means for removing articles from said container when said door of said container and said port door are opened.

5. A SMIF system for maintaining the cleanliness of articles to be processed, comprising:

a SMIF pod which defines a first interior space for containing the articles, said SMIF pod comprising:
a box,
a box door which releasably engages and sealably mates with said box, and
a cassette for holding the articles, said cassette resting on said box door;

a station which defines a second interior space, said station comprising:
a port plate which sealably mates with said box, said port plate having a gas inlet and a gas outlet,
a port door which releasably engages and sealably mates with said port plate to maintain the environment within said station, and which supports said box door when said box door is disengaged from said box, means for maintaining a reduced pressure in said gas outlet of said port plate, and a mechanism for moving said port door between a first position in which said port door engages and seals with said port plate, a second position in which said box door is disengaged from said box and said interior space of said SMIF is exposed to said gas outlet of said port plate so that the gas in said interior region of said SMIF pod is substantially exhausted through said gas outlet, and a third position in which said cassette is entirely contained within said second interior space of said station.

6. A SMIF system according to claim 5, further comprising isolation means, provided in said interior region of said processing station, for providing an isolation region isolating said port door from the remaining portion of said interior region of said processing station and for preventing gas from entering said interior region of said processing station from said isolation region when said port door is in said first and second second positions.

7. A SMIF system according to claim 6, wherein said isolation means comprises a port door cover, and means for biasing said port door cover so that said port door cover forms a seal with said port plate.

8. A system for removing articles to be processed from a sealable container, comprising:

a container having an interior region and a door which makes a seal with said container to establish a controlled environment isolated from ambient atmospheric conditions in said interior region;

a processing station having an interior region and a port, said port receiving said container, making a seal with said container, and having a gas outlet;

a port door, provided on said processing station, for controlling access to said interior region of said processing station through said port;

isolation means, provided in said interior region of said processing station, for providing an isolation region in a first portion and isolated from a second portion of said interior region of said processing station and for preventing gas from entering said interior region of said processing station from said isolation region;

means for creating a reduced pressure with respect to said interior region of said container in said gas outlet;

means for opening said door of container container and said port so that said reduced pressure in said gas outlet removes gas from said interior region of said container and said isolation region; and means for transferring articles from said container to said processing station.

9. A system for removing articles from a sealable container according to claim 8, wherein said means for opening comprising means for moving said port door between a first position in which said port door engages and seals with said port, and a second position in which said port door is disengaged from said port, said box door is disengaged from said box and said interior space of said container is exposed to said gas outlet of said port.

10. A SMIF system for maintaining the cleanliness of articles to be processed, comprising:

a SMIF pod which defines a first interior space for containing the articles, said SMIF pod comprising:
- a box,
- a box door which releasably engages and sealably mates with said box, and
- a cassette for holding the articles, said cassette resting on said box door;

a station which defines a second interior space, said station comprising:
- a port plate which sealably mates with said box,
- a port door which releasably engages and sealably mates with said port plate to seal said second interior space, and which supports said box door when said box door is disengaged from said box,
- means for moving said port door between a first position in which said port door engages said seals with said port plate, a second position in which said box door is disengaged from said box, and a third position in which said cassette is entirely contained within said second interior space of said station,
- a port door cover,
- means for biasing said port door cover so that said port door cover forms a seal with said port plate to create an isolation region which isolates said port from said second interior space, and
- means for creating a reduced pressure in said isolation region.

11. A system for removing articles from a sealable container, comprising:
- a container having an interior region and a door which makes a seal with the container to establish a controlled environment isolated form ambient atmosphere conditions in said interior region;
- a processing station having an interior region and a port, said port receiving said container, making a seal with said container, and having a gas inlet and a gas outlet;
- a port door, provided on said processing station, for controlling access to said interior region of said processing station through said port;
- isolation means, provided in said interior region of said processing station, for providing an isolation region in and isolated from the remaining portion of said interior region of said processing station and for preventing gas from entering said interior region of said processing station from said isolation region;
- mensa for creating an increased pressure in said gas inlet;
- means for opening said door of said container and said port so that said increased pressure in said gas inlet causes gas to be removed from said interior region of said container and said isolation region; and
- means for transferring articles from said container to said processing station.

* * * * *

UNITED STATES PATENT AND TRADEMARK OFFICE
CERTIFICATE OF CORRECTION

PATENT NO. : 5,169,272
DATED : December 8, 1992
INVENTOR(S) : Bonora, et al.

It is certified that error appears in the above-identified patent and that said Letters Patent is hereby corrected as shown below:

Column 10, line 31, change "$P_1$" to --$P_4$--.
Column 10, line 39, change "poured" to --purged--.
Column 10, line 54, change "atmosphere" to --atmospheric--.
Column 11, line 18, change "from" to --form--.
Column 12, line 9, change "said SMIF is" to --said SMIF pod is--.
Column 12, line 23, change "second second" to --said second--.
Column 12, line 52, change "container container" to --said container--.
Column 13, line 18, change "engages said seals" to --engages and seals--.
Column 14, line 5, change "form" to --from--.
Column 14, line 21, change "mensa" to --means--.

Signed and Sealed this

Fourteenth Day of June, 1994

Attest:

BRUCE LEHMAN

*Attesting Officer*    *Commissioner of Patents and Trademarks*